United States Patent
Naumovski et al.

(10) Patent No.: US 8,907,295 B2
(45) Date of Patent: Dec. 9, 2014

(54) HYBRID ELECTROSTATIC LENS WITH INCREASED NATURAL FREQUENCY

(75) Inventors: Oliver V. Naumovski, Peabody, MA (US); Shardul Patel, North Reading, MA (US); Charles A. Teodorczyk, Danville, NH (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 13/564,450

(22) Filed: Aug. 1, 2012

(65) Prior Publication Data

US 2014/0034843 A1      Feb. 6, 2014

(51) Int. Cl.
*H01J 49/06* (2006.01)
*H01Q 9/04* (2006.01)

(52) U.S. Cl.
CPC .............. *H01J 49/062* (2013.01); *H01Q 9/04* (2013.01)
USPC ....... 250/396 R; 428/367; 428/368; 343/791; 343/872; 343/873

(58) Field of Classification Search
CPC ....................................................... H01B 7/16
USPC ............. 428/39.9, 39.91, 367, 368; 138/140, 138/148, 177; 343/791, 872, 873
See application file for complete search history.

(56) References Cited

U.S. PATENT DOCUMENTS

| | | | | |
|---|---|---|---|---|
| 2,981,950 A * | 4/1961 | Skidmore | ...................... | 343/788 |
| 3,305,331 A | 2/1967 | Kiyoshi Inoue | | |
| 3,309,455 A * | 3/1967 | Mildner | ........................... | 174/29 |
| 4,740,990 A * | 4/1988 | Radev et al. | .................... | 373/88 |
| 5,033,028 A * | 7/1991 | Browning | ......................... | 367/1 |
| 5,086,256 A * | 2/1992 | Tokiguchi et al. | ........ | 315/111.81 |
| 5,554,997 A * | 9/1996 | Cobb | ............................ | 343/793 |
| 5,757,334 A * | 5/1998 | Cobb | ............................ | 343/873 |
| 2004/0174318 A1 * | 9/2004 | Aisenbrey | .................... | 343/897 |
| 2004/0239570 A1 * | 12/2004 | Aisenbrey | .................... | 343/702 |
| 2008/0132046 A1 | 6/2008 | Walther | | |
| 2010/0171042 A1 * | 7/2010 | Kellerman et al. | ....... | 250/396 R |

FOREIGN PATENT DOCUMENTS

| | | |
|---|---|---|
| GB | 371814 A | 4/1932 |
| JP | H11-320098 A | 11/1999 |
| WO | 2010/077418 A1 | 7/2010 |

OTHER PUBLICATIONS

International Search Report and Written Opinion mailed Sep. 26, 2013 for PCT/US2013/048605 Filed Jun. 28, 2013.

* cited by examiner

*Primary Examiner* — Jack Berman
*Assistant Examiner* — James Choi

(57) ABSTRACT

A composite electrostatic rod may include a body comprising a length L and cross sectional area A. The body may include an outer portion comprising a first material, and a core comprising a second material different than the first material and surrounded by the outer portion, wherein a natural frequency of the composite electrostatic rod is greater than that of a graphite rod having the length L and cross sectional area A.

18 Claims, 7 Drawing Sheets

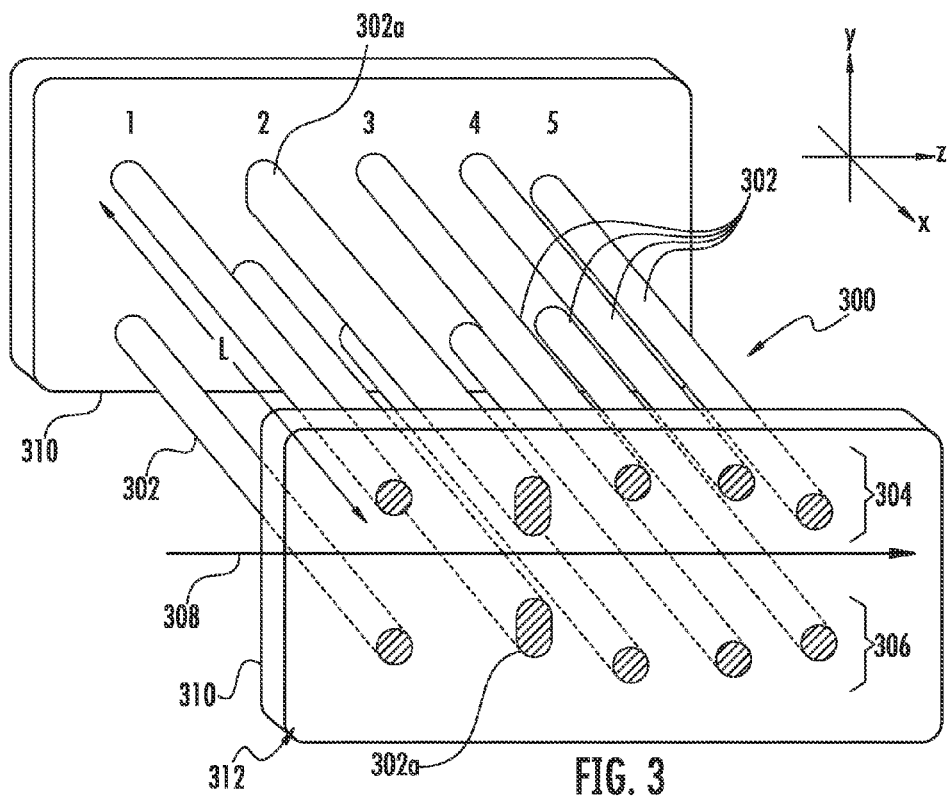
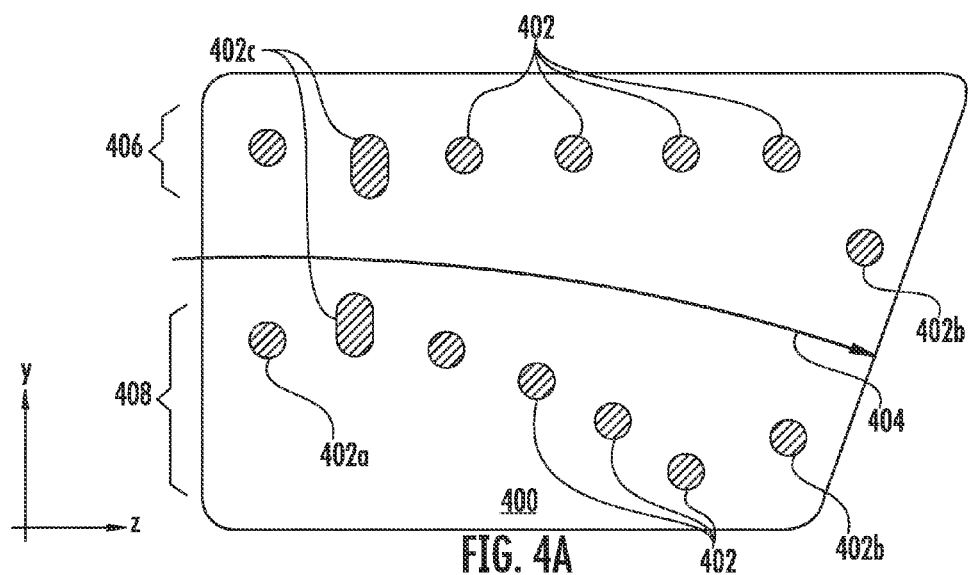

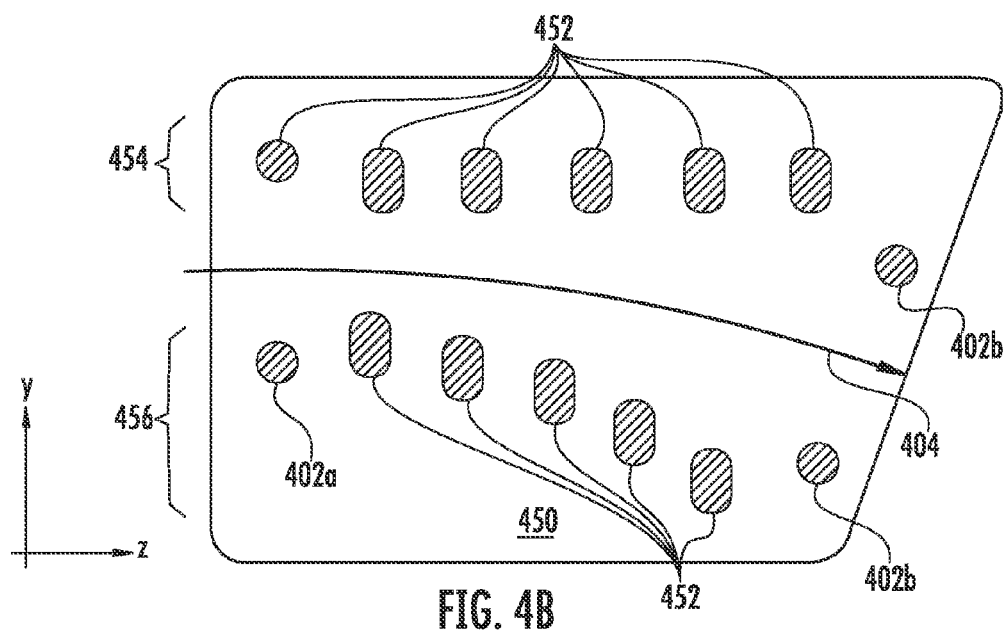
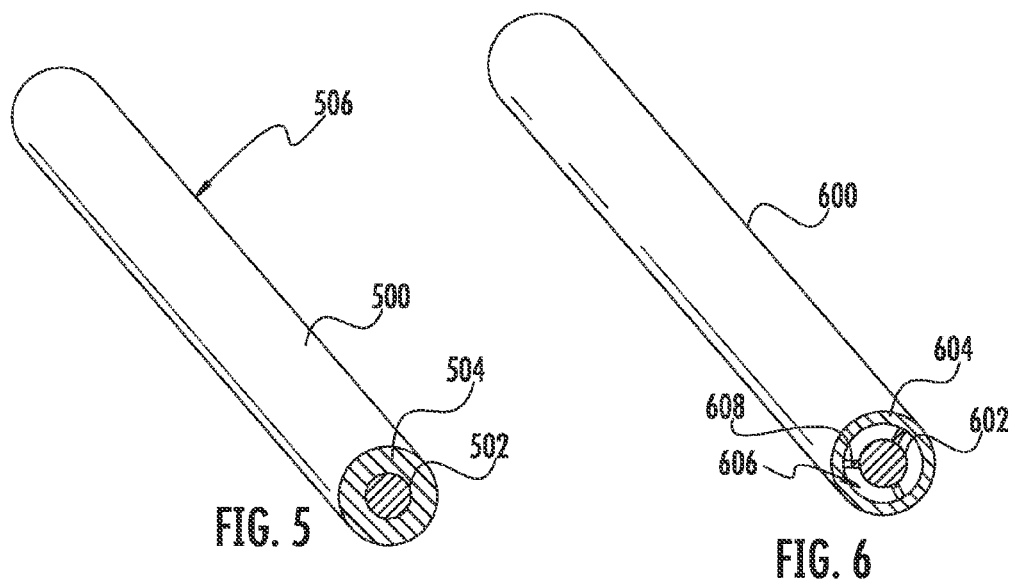

HYBRID ELECTROSTATIC LENS WITH INCREASED NATURAL FREQUENCY

FIELD

This invention relates to ion beam implantation systems and more particularly, to electrostatic lenses in a beam-line implantation system and a composite electrostatic rod for use in the electrostatic lens.

BACKGROUND

Electrostatic lenses are used in applications such as ion implantation to control beam energy, focusing, and direction, among other operations. FIG. 1 shows a conventional ion implantation apparatus (ion implanter) 100 which comprises an ion source 102, extraction electrodes 104, a 90° magnet analyzer 106, a first deceleration (D1) stage 108, a magnet analyzer 110, and a an electrostatic lens 112. The D1 deceleration stage (also known as "deceleration lens") is comprised of multiple electrodes with a defined aperture to allow an ion beam 114 to pass therethrough. By applying different combinations of voltage potentials to the multiple electrodes, the D1 deceleration lens can manipulate ion energies and cause the ion beam to hit a target wafer 116 at a desired energy. The electrostatic lens 112 may have multiple electrodes in the form of rods to which different combinations of voltage potentials may be applied to manipulate ion beam 114 as it passes therethrough. The above-mentioned deceleration stage 108 and the electrostatic lens 112 are typically electrostatic deceleration lenses.

FIG. 2a depicts a side view of a conventional electrostatic lens 200 using rod-shaped electrodes. in accordance with an embodiment of the present disclosure. The lens configuration of the electrostatic lens 200 using rod-shaped electrodes may also include several sets of electrodes, such as a set of entrance electrodes 202, one or more sets of suppression/focusing electrodes 204, and a set of exit electrodes 206. Each set of electrodes may have a space/gap to allow ions to pass therethrough with a central ray trajectory ("c.r.t." or "crt") of an ion beam 210 and at a deflection angle 95. The rod-shaped electrodes may be made of non-contaminating material, such as graphite, glassy carbon, and/or other non-contaminating material. It should be appreciated that the electrodes may also be made of materials with low thermal expansion coefficients As illustrated in FIG. 2a the electrodes in the lens 200 using rod-shaped electrodes may be "flared" such that an opening for the ion beam 210 at the exit electrode 206 may be greater than an opening for the ion beam 210 at the entrance electrode 202. Accordingly, openings at each set of the suppression/focusing electrodes 204 may gradually increase or "flare" open. Also, symmetry may be maintained about the crt of the ion beam 210. The rod-shaped electrode rods may effectively provide independent control of deflection, deceleration, and/or focus during an ion implantation process. As further shown in FIG. 2a, a pump 212 may be directly or indirectly connected to the housing 214. In one embodiment, the pump 212 may be a vacuum pump for providing a high-vacuum environment or other controlled environment. In other embodiments, the housing 214 may include one or more bushings 216. These bushings 216 may be used to electrically isolate the housing 214 from other components.

In operation, the entrance electrode 202, the suppression/focusing electrodes 204, and the exit electrode 206 are independently biased such that the energy and/or shape of the ion beam 20 is manipulated in the following fashion. The ion beam 210 may enter the electrostatic lens 200 through the entrance electrode 202 and may have an initial energy of, for example, 10-20 keV. Ions in the ion beam 210 may be accelerated between the entrance electrode 202 and the suppression/focusing electrodes 204. Upon reaching the suppression electrodes 204, the ion beam 210 may have an energy of, for example, approximately 30 keV or higher. As the ion beam 210 propagates between the suppression/focusing electrodes 204 and the exit electrode 206, the ions in the ion beam 210 may be decelerated, typically to an energy that is closer to the one used for ion implantation of a target wafer. In one example, the ion beam 210 may have an energy of approximately 3-5 keV or lower when it exits the electrostatic lens 200.

In certain applications, particularly those requiring implantation of large workpieces, such as 300 mm wafers or larger as the implantation target, it is advantageous to generate ion beams in the form of ribbon-shaped beams having high aspect ratios such that the cross-section of the beam is much larger in one dimension (W) than the other (H) as is illustrated in FIG. 2b. These ribbon beams are commonly used in ion implanter apparatus and implantation systems where a single workpiece such as a silicon wafer or flat panel display is moved in a single dimension through the ion beam. In these instances, the cross-section of the width W of the ribbon ion beam, that is longer dimension of the ion beam cross-section, is much larger than the length H.

In order to produce a stable ion beam, it is important that beamline components such as an electrostatic lens operate in a stable fashion. Conventional electrostatic lens components are constructed from a material such as graphite, which provides low contamination to a beam passing through the electrostatic lens. However, upon occasion, the graphite rods may vibrate at a natural frequency that is characteristic of the length of the material. The natural frequency refers to the frequency at which an element, such as a rod or beam, vibrates once the element has been set into motion.

Referring again to FIG. 2a, in the case where electrodes 204 are graphite rods, this vibration causes a fluctuation dS in the separation S of the electrodes 204 in a direction (Y) perpendicular to the direction of propagation (Z) of the ion beam 210 passing between the sets of electrodes 202-206. The fluctuation in separation dS in turn leads to fluctuations in the electric field strength experienced by the ion beam 210 passing through the electrostatic lens. In particular, the electric field fluctuation in the electrostatic lens may take place according to the vibration frequency of the electrostatic lens electrodes. Referring also to FIG. 2b, such fluctuations in the electric field may perturb the ion beam 210 in a manner that causes spatial fluctuations in the ion beam 210 in the Y-direction leading to a less uniform ion beam.

During ion implantation, a wafer may be moved with respect to the ion beam and any non-uniformity in the ion beam caused by such fluctuations may be averaged out, leading to a uniformly implanted wafer. However, occasionally, the non-uniformity of the ion beam caused by vibrations in the electrostatic lens may express itself as micro-striping on the wafer, which denotes the generation of non-uniform ion dose on the wafer, where each stripe represent a region of ion dose that is different from an adjacent region. Referring to FIGS. 2b and 2c, if the wafer is moved along path 220 along the Y-direction with respect to the ion beam 210, the microstriping may form stripes 222 where the ion dose varies between different stripes. As shown in FIG. 2c, the long axis of the stripes may be parallel to the long axis of the ion beam 210, that is, parallel to the X-direction. This effect may be observable in particular when the vibration frequency of the electrodes is relatively low and the rate of wafer movement is relatively high. In principle, the micro-striping effect may be reduced or eliminated by moving the wafer with respect to the ion beam at a rate sufficiently low as to permit the ion beam fluctuations to cancel one another out within each region of the substrate that is implanted. However, the reduced rate of movement of the wafer needed to eliminate the microstriping may lead to a reduced throughput rate for substrates. Moreover, as the dimension of substrates increase, it may be useful to provide wider ribbon beams, and wider electrostatic lenses to process such ion beams, leading to rods that may extend beyond one meter in length. At this dimension, the micro-striping problem caused by rod vibration may be exacerbated due to lower vibration frequency and/or greater fluctuation dS in the rods. In view of the above, it will be apparent that improvements in electrostatic lens construction are needed.

SUMMARY

In one embodiment, a composite electrostatic rod may include a body that has a length L and cross sectional area A. The body may include an outer portion comprising a first material, and a core comprising a second material different than the first material and surrounded by the outer portion, wherein a natural frequency of the composite electrostatic rod is greater than that of a graphite rod having the length L and cross sectional area A.

In another embodiment, an electrostatic lens may include a first set of electrostatic rods and a second set of electrostatic rods. The first and second sets of electrostatic rods may define a gap to transmit an ion beam therebetween. One or more electrostatic rods of the first and second set of electrostatic rods may be a composite electrostatic rod that has a core comprising a first material and outer portion comprising a second material different than the first material and surrounding the core. A natural frequency of the composite electrostatic rod may be greater than that of a graphite rod having the length L and cross sectional area A.

BRIEF DESCRIPTION OF THE DRAWINGS

For a better understanding of the present disclosure, reference is made to the accompanying drawings, which are incorporated herein by reference and in which:

FIG. 2b depicts an end view of the electrostatic lens of FIG. 2a.

FIG. 2c depicts a substrate processed according to the electrostatic lens of FIG. 2a.

FIG. 4b depicts still another electrostatic lens consistent with the present embodiments.

FIG. 5 depicts one embodiment of a composite electrostatic rod.

FIG. 6 depicts another embodiment of a composite electrostatic rod.

FIG. 7b depicts a cross-sectional perspective view of the assembled composite electrostatic rod of FIG. 7a.

FIG. 7c depicts an end cross-sectional end view of the assembled composite electrostatic rod of FIG. 7a.

FIG. 7d depicts a perspective cross-sectional end view of the assembled composite electrostatic rod of FIG. 7a.

DETAILED DESCRIPTION

Embodiments disclosed herein provide improved electrostatic lenses. In some embodiments, the electrostatic lenses are deployed in a beam line implanter in which the electrostatic lens defines an aperture or gap through which an ion beam may pass when the ion source generates an ion beam. In some embodiments, the electrostatic lens is configured to apply an electric field to a ribbon ion beam.

In various embodiments, an improved rod component of an electrostatic lens is provided. The improved rod component, or electrostatic rod, is an elongated structure that comprises an electrically conductive material, such as graphite. According to various embodiments, the electrostatic rod of an electrostatic lens comprises a composite structure in which graphite or another suitable material forms an outer portion that surrounds an inner portion that is made from a metallic material. In some embodiments, the electrostatic lens rod includes a hollow portion that is also surrounded by the outer portion. The composite electrostatic lens rod may have a larger specific stiffness as compared to a conventional graphite rod.

In various embodiments, a composite electrostatic lens rod is provided that has a higher natural frequency as compared to a conventional graphite rod having the same dimensions and shape as the composite electrostatic lens rod. In particular embodiments, the natural frequency is greater than 75 Hz. The higher natural frequency results in a more rapid fluctuation of electrical fields applied to an ion beam that traverses an electrostatic lens constructed from an assembly of multiple composite electrostatic lens rods.

Figure 3:
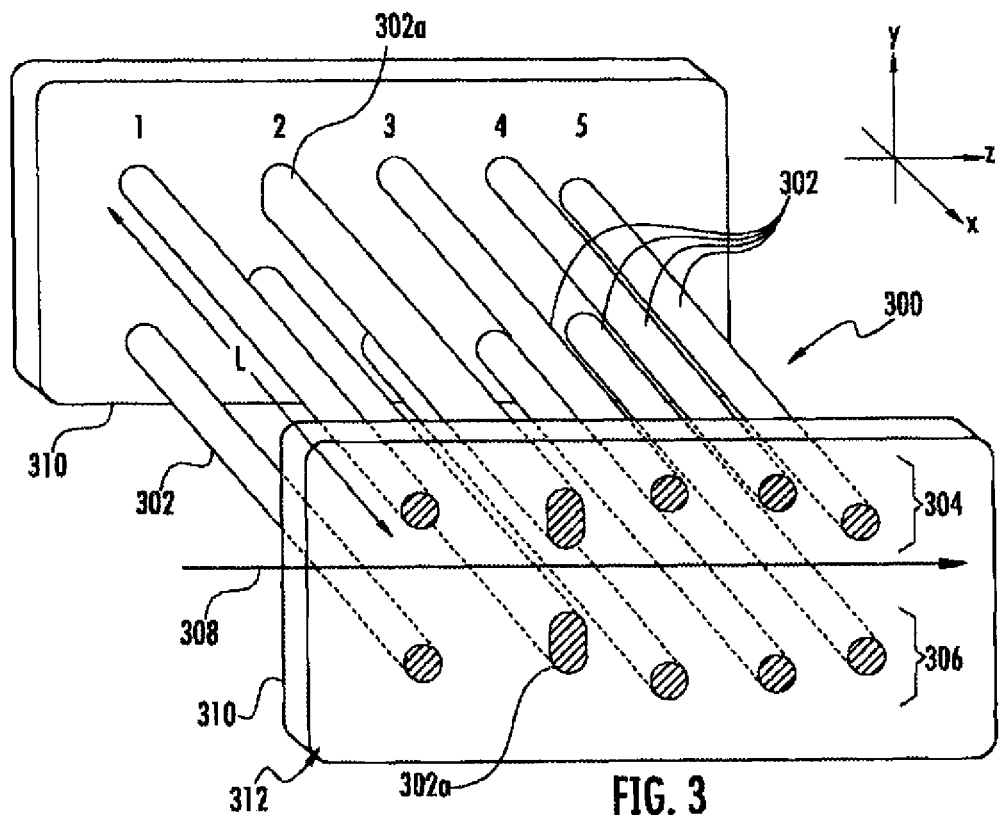
FIG. 3 depicts an electrostatic lens consistent with the present embodiments.

FIG. 3 depicts a perspective view of an electrostatic lens 300 consistent with the present embodiments. The lens 300 includes multiple electrostatic rods 302, which are arranged in an upper rod assembly 304 and lower rod assembly 306. The terms "upper" and "lower" as used herein with respect to the rod assemblies of the lens are arbitrary and used to distinguish between sets (assemblies) of rods that are disposed such that an ion beam 308 (illustrated by a central ray trajectory) passes between the sets of rods. In general, each electrostatic rod 302 may be coupled to a voltage source independently of other rods. However, in some cases, a pair of electrostatic rods that are generally opposite one another and are mutually disposed in different rod assemblies, may be coupled to a common voltage. The voltage supplied to each such pair or electrostatic rods 302 may differ from that applied to other pairs of electrostatic rods according to the desired field to be applied to the ion beam.

Figure 1:
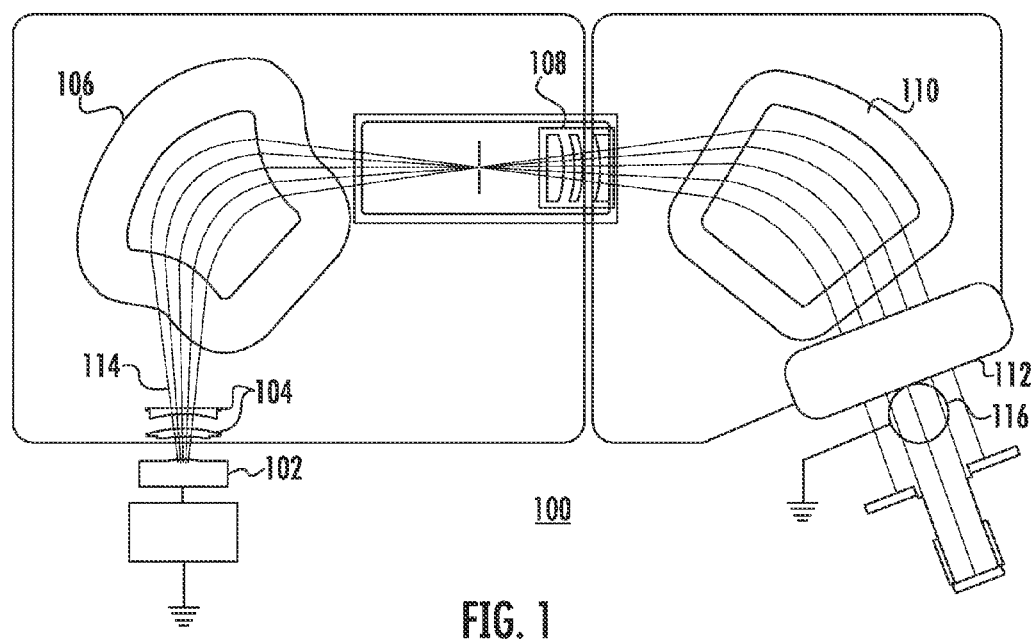
FIG. 1 depicts a known ion implantation system.
Figure 2A:
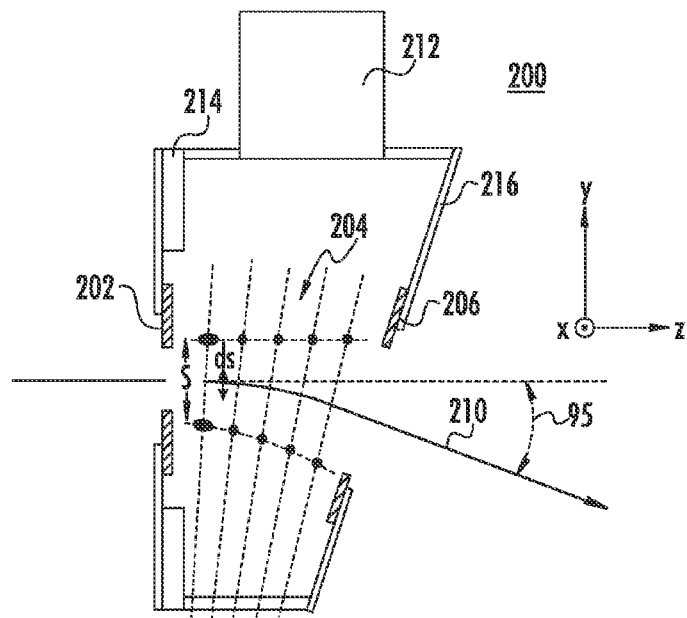
FIG. 2a depicts a side view of a known electrostatic lens.
Figure 2B:
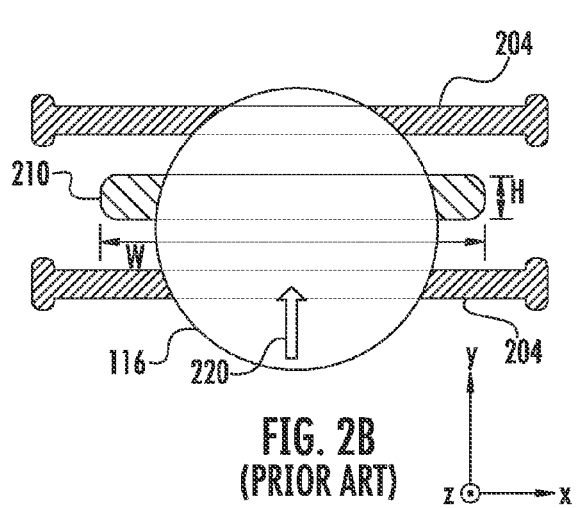
Figure 2C:
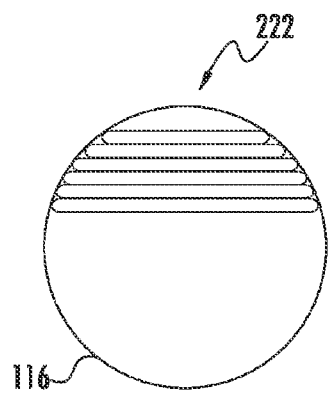

Consistent with the present embodiments, one or more of the electrostatic rods 302 may be a composite electrostatic rod that exhibits a higher natural frequency than a conventional electrostatic rod, as discussed further below. In this manner, the frequency of vibration of the electrostatic rod in the Y direction, that is, the direction generally perpendicular to the direction of propagation of the ion beam, may be sufficiently high to reduce ion beam non-uniformities that may otherwise cause a non-uniform implantation on a workpiece (substrate), particularly when that workpiece is scanned along a given direction (see, e.g., FIG. 2(c) where the wafer is moved along the Y direction resulting in stripes of different ion dose) while exposed to the ion beam 308.

In the embodiment particularly illustrated in FIG. 3, one pair of electrostatic rods 302a is illustrated as being composite electrostatic rods. However, other electrostatic rods 302 may, but need not be, composite electrostatic rods. In one embodiment, one or more pairs of electrostatic rods 302 may be arranged as composite electrostatic rods based upon the voltage to be applied to the electrostatic rods. For example, in a deceleration lens, the voltage to be applied to successive sets of electrostatic rod pairs may decrease from position 1 to position 5. Accordingly, a relatively high voltage may be applied to the electrostatic rods 302a, disposed at position 2, which may be the first suppressor electrodes. Because of the relatively high voltage applied to electrostatic rods 302a, any spatial displacement, especially in the Y direction, may have a greater effect on an ion beam 308 traversing the electrostatic lens 300, than, for example, a similar spatial displacement at position 4, where a lower voltage may be applied. Accordingly, the electrostatic rods 302a are selected to be composite electrostatic rods having a high natural frequency. In this manner, even if vibration of electrostatic rods 302a causes a significant fluctuation of the ion beam 308, the frequency of such vibration may be sufficiently high that the ion beam fluctuations at a workpiece surface are averaged out to provide a uniform ion dose at the workpiece. Beam fluctuations from other pairs of electrostatic rods 302, which are supplied with lower voltage, such as those at positions 3-5, may generate less disturbance of the ion beam. Accordingly, electrostatic rods disposed at positions 3-5 may be conventional electrostatic rods having lower natural frequency.

Each electrostatic rod 302 may comprise an elongated structure having a length L that extends between support structures 310, where L is about 20 cm to 200 cm. Although not explicitly depicted, an electrostatic rod 302 may extend through a support structure 310 and may extend beyond the outwardly facing surface 312 of the support structure 310. A cross-section of each rod may be generally elliptical, or may have a more complex cross-section. In some embodiments, the outer dimensions and cross-sectional shape may be similar to that of a conventional electrostatic lens rod, except as otherwise disclosed herein. For example, the dimension of the electrostatic rod 302 in the Y and Z directions may be within a factor of 2 of the respective dimensions of a conventional electrostatic rod. The length L of the electrostatic rods 302 along the X direction may be within about 10% of the comparable length of conventional electrostatic rods so that the electrostatic rods 302 can be interchanged in one or more positions within a conventional electrostatic lens assembly.

Figure 4A:
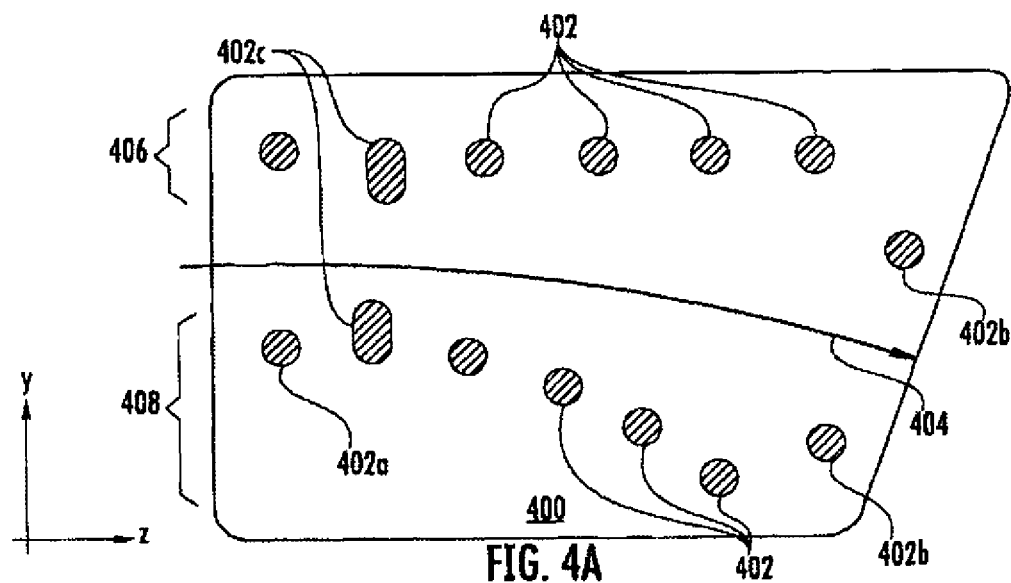
FIG. 4a depicts another electrostatic lens consistent with the present embodiments.
Figure 7A:
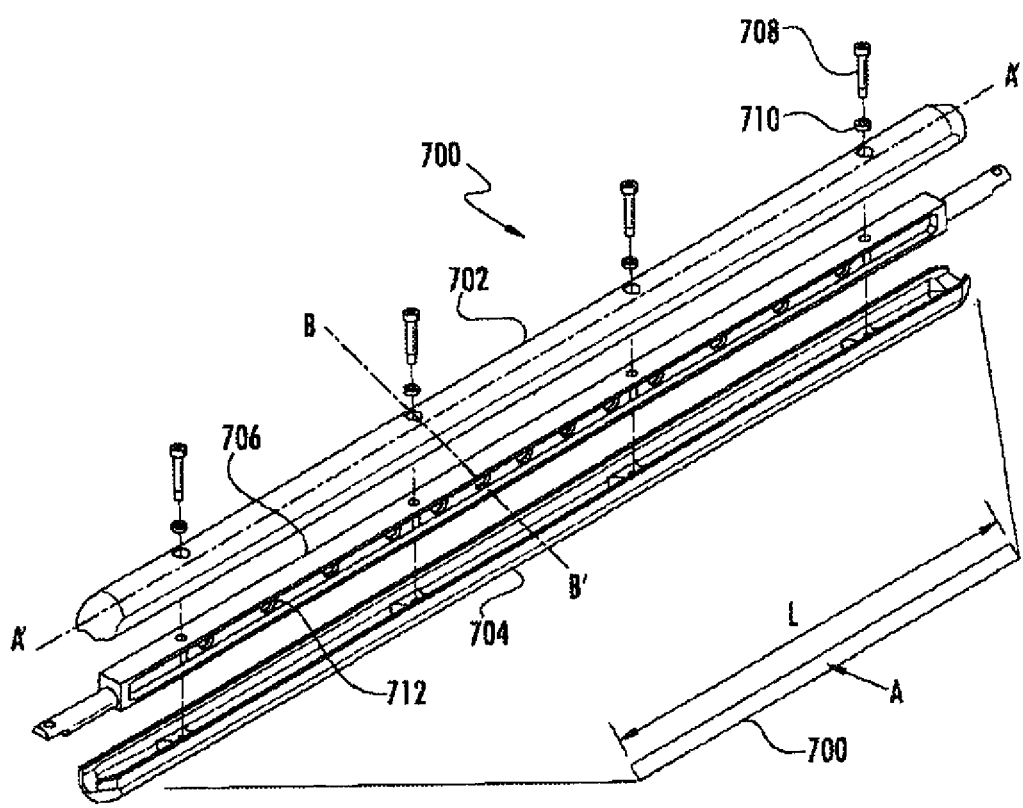
Figure 7B:
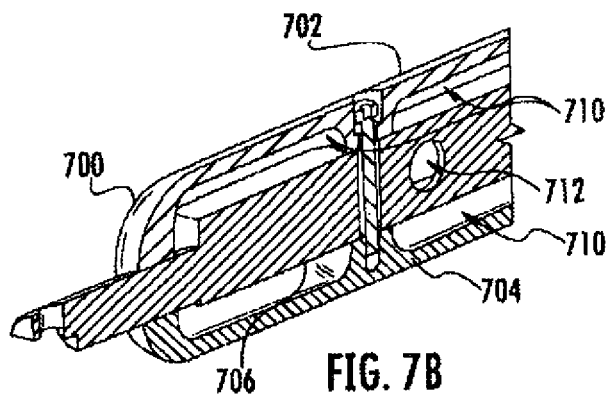
Figure 7C:
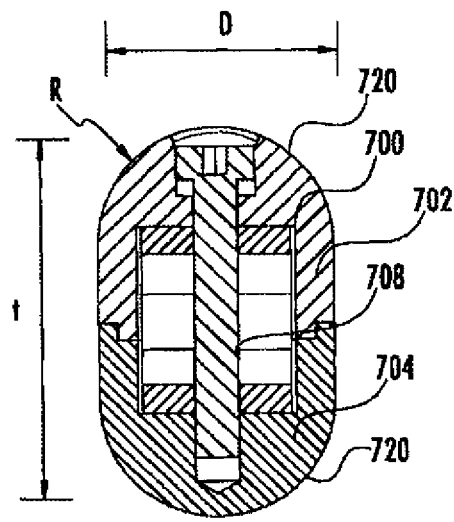
Figure 7D:
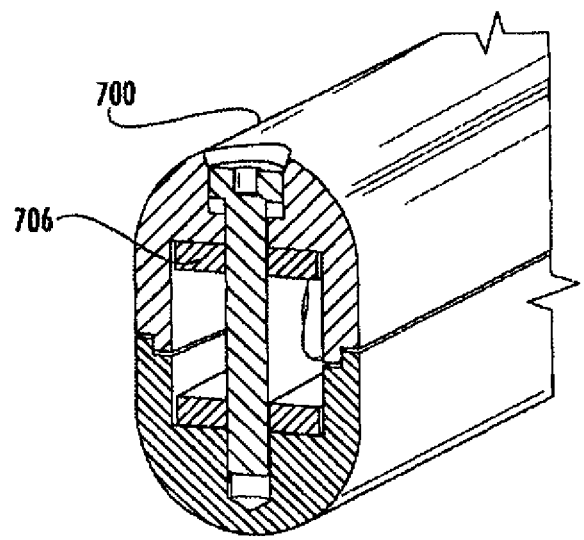
Figure 8:
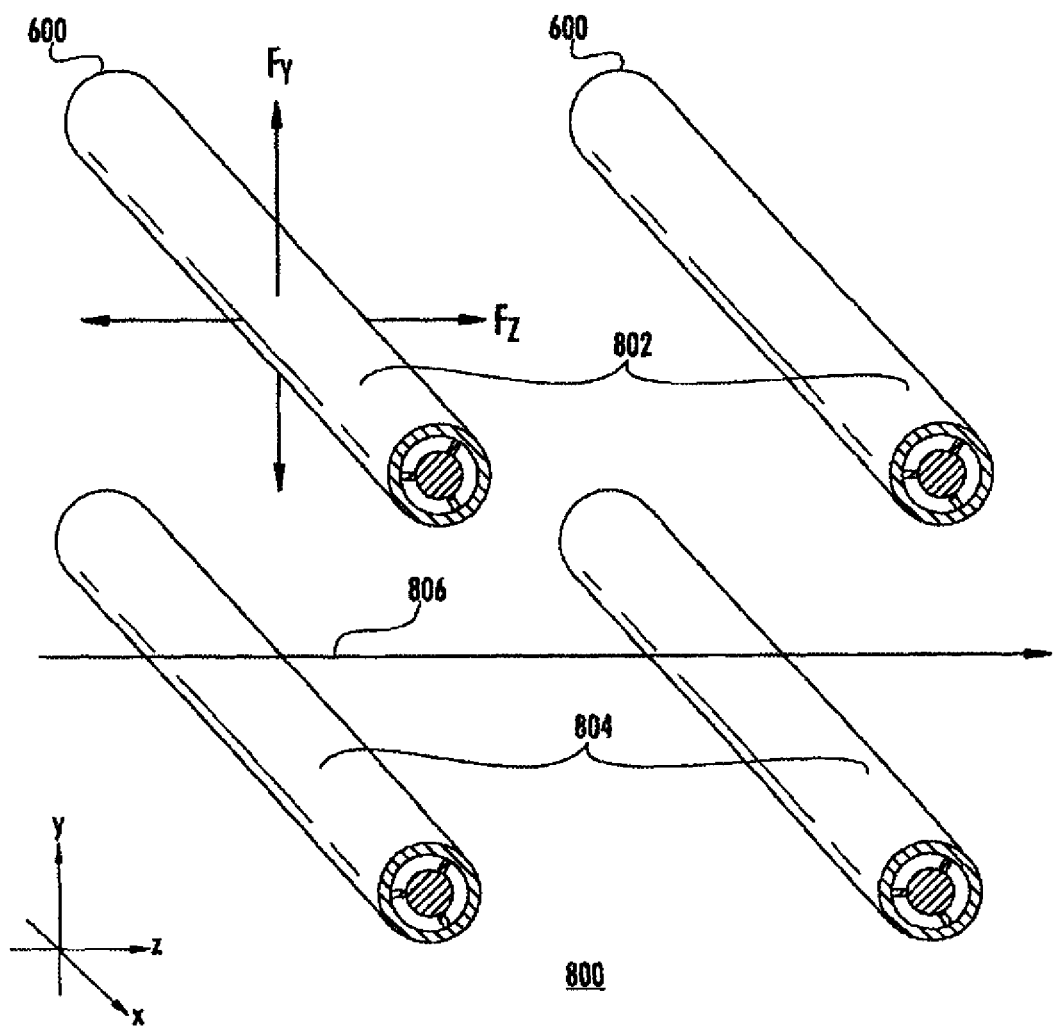

FIG. 4a depicts a side view of another embodiment of an electrostatic lens 400. In this embodiment, the electrostatic rods 402 are arranged so that when voltage is applied to the electrostatic rods 402, the direction of an ion beam 404 may be deflected s shown. Except for entrance electrodes 402a and exit electrodes 402b, the upper set 406 of electrostatic rods 402 may be arranged generally within a plane, while the lower set 408 of electrostatic rods 402 are arranged along an arc. In the embodiment of FIG. 4, a pair of electrostatic rods 402c are configured as composite electrostatic rods to provide a higher natural frequency. However, consistent with various embodiments, any or all of the electrostatic rods 402 may be configured as composite electrostatic rods.

FIG. 4b depicts a side view of another embodiment of an electrostatic lens 450. In this embodiment, a group of electrostatic lenses in each of the upper set 454 and lower set 456 of electrodes are arranged as composite electrostatic rods 452, except for entrance electrodes 402a and exit electrodes 402b. The composite electrostatic rods 452 may function, for example, as suppressor electrodes.

In various embodiments, a separation between a pair of opposing electrostatic rods, where one electrostatic rod is located in an upper rod assembly and its counterpart in the pair is located in a lower rod assembly, is about five to thirty centimeters. Accordingly, for electrostatic rods characterized by a length L of 30 cm or more, the length of the electrostatic rods may be much longer than the separation between opposing electrostatic rods. Vibration in such a relatively long electrostatic rod along the Y direction may be sufficient to cause an appreciable change in the separation of opposing electrostatic rods, and thereby may appreciably affect the electrostatic field defined by the electrostatic rods during operation. For this reason, the present embodiments provide improved composite electrostatic rods that, while not eliminating vibrations, increase the natural frequency of the electrostatic rods so as to increase the frequency of electric field fluctuations and thereby the frequency of perturbations to the ion beam.

The composite structure includes an inner portion that imparts strength to the electrostatic rod and an outer portion that generally surrounds and encases the inner portion. The inner portion, or core, may be constructed from a material such as a metal that imparts a stiffness to the electrostatic rod sufficient to increase its natural frequency above that characteristic of conventional graphite electrostatic rods of the same dimension.

FIG. 5 depicts a perspective view of a composite electrostatic rod 500 according to the present embodiments. The electrostatic rod 500 includes a core 502 and outer portion or shell 504. In various embodiments, the outer portion 504 may be selected to provide a material on the outer surface 506 of the electrostatic rod 500 that provides a low source of contamination to an ion beam. In some embodiments, the outer portion 504 is made from graphite, such as the graphite material used in conventional electrostatic rods. In other embodiments, the outer portion 504 is a silicon material.

In various embodiments, the core 502 includes a material such as aluminum, steel, carbon composite, other composite, or other structural material suitable for an electrode that imparts a greater stiffness to the electrostatic rod 500 than to a graphite rod of the same dimensions. In this manner, the natural frequency of the electrostatic rod 500 is increased, as discussed further below.

FIG. 6 depicts another embodiment of an electrostatic rod. The electrostatic rod 600 includes a graphite shell 604 and metal core 602. The electrostatic rod 600 further includes a hollow portion 606 that is generally disposed between the graphite shell 604 and metal core 602. The electrostatic rod 600 may include connector portions 608 that extend between the graphite shell 604 and metal core 602. The connector portions 608 contact and hold the metal core 602 so as to create a single rigid structure for the electrostatic rod 600. In various embodiments, the connector portions 608 may be widely spaced to provide a large volume of the hollow portion 606. In this manner, the overall weight of the electrostatic rod 600 may be minimized for a given overall size of the electrostatic rod 600 and a given overall size of the metal core 602. By minimizing the weight of the electrostatic rod 600, the natural frequency of the electrostatic rod 600 may be maximized, as detailed below.

Figure 7A:
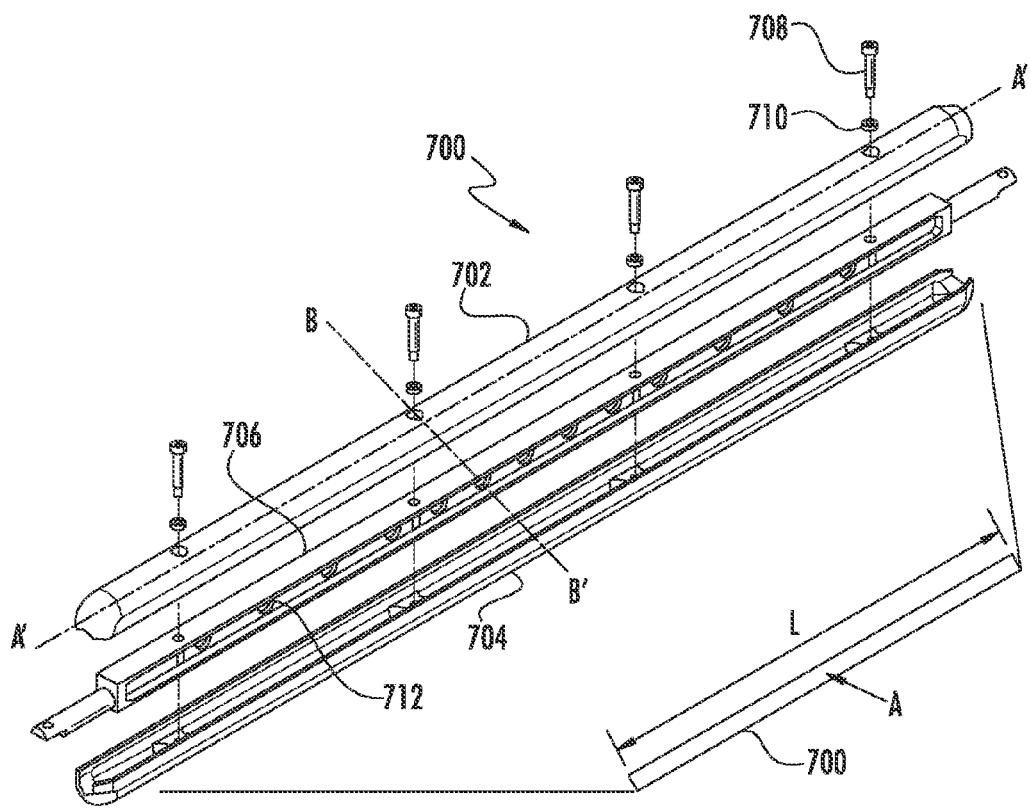
FIG. 7a depicts an exploded perspective view of a composite electrostatic rod according to one embodiment.
Figure 7B:
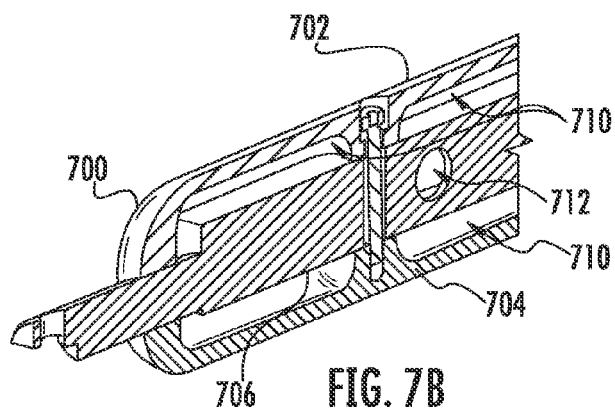
Figure 7C:
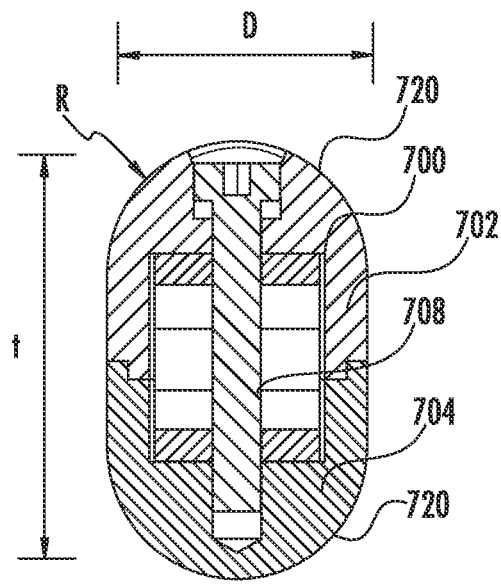

In some embodiments, a composite electrostatic rod may comprise multiple parts that may be reversibly assembled and disassembled, while in other embodiments the multiple parts may be arranged to remain assembled after the initial assembly. FIG. 7a depicts an exploded view in perspective of an electrostatic rod 700 consistent with additional embodiments. FIG. 7b illustrates a cross-sectional view in perspective of the assembled electrostatic rod 700 along A'-A', while FIG. 7c illustrates a cross-sectional view of the assembled electrostatic rod 700 along B-B'.

Figure 7D:
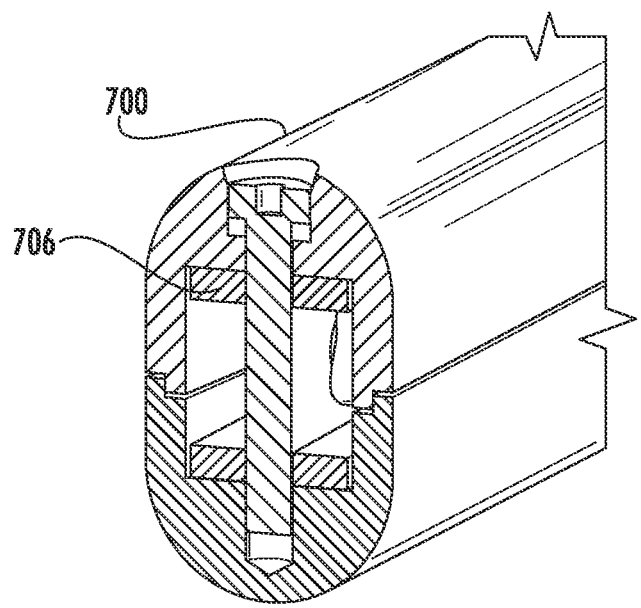

The electrostatic rod 700 includes an upper shell 702, lower shell 704, and core 706, where the terms "upper" and "lower" are used merely to distinguish between the shells 704, 706. The upper shell 702 and lower shell 704 may be fabricated from graphite. In the embodiment of FIG. 7a, the upper shell 702, lower shell 704, and core 706 may be joined to form a single rod using fasteners 708 and 710, which may be a screw and washer. In some embodiments, the core 706 may include holes 712, and the core may have a capital "I"-shaped cross-section perpendicular to its long direction defined by the length L, as illustrated in FIGS. 7c and 7d. When assembled, the upper and lower shell 702, 704 surround the core 706. The assembled structure defines multiple hollow regions 710 between the core 706 and surrounding upper and lower shell 702, 704. The three part structure of electrostatic rod 700 allows different core materials to be used as the core 706 so long as the overall dimension and shape of the core 706 is maintained. Thus, to change the properties of core 706, a rod of aluminum may be exchanged for a rod made of steel, or a composite rod material.

In accordance with various embodiments, the natural frequency of an electrostatic rod is increased by increasing the ratio of the specific strength of the electrostatic rod as compared to conventional graphite rods. As illustrated in the figures, the electrostatic rods of an electrostatic lens are fixed on two ends, such that their behavior can be approximated by the behavior of a beam of length L and cross-sectional area A that is fixed on both ends and supporting a weight m, as also depicted in FIG. 7a. The natural frequency F for vibration of such a beam may be expressed as $F=(k/m)^{1/2}$, where k is the beam stiffness. The parameter k, in turn is equal to AE/L, where E is the elastic modulus of the material that comprises the beam. Accordingly, fabrication of a composite rod with a core material that is stronger than graphite may tend to increase the average elastic modulus $E_{AV}$ of the composite beam as compared to the elastic modulus of a pure graphite beam. On the other hand, if the mass of the beam increases in a composite beam, the natural frequency tends to decrease.

Accordingly, in some embodiments a core material may be selected such that the core material has a higher strength to weight ratio as given by E/m than graphite. In other embodiments a core material of a composite electrostatic rod may have a higher elastic modulus than graphite but need not have a higher E/m ratio than graphite. Instead, the composite electrostatic rod may be provided with sufficient hollow portions to provide an overall higher effective E/m ratio than a graphite rod of comparable volume.

In accordance with various embodiments, the length L of a composite electrostatic rod may be about 60 to 90 cm, and the cross-section of the rod may be elongated in the direction perpendicular to the direction of beam travel, as generally illustrated at FIG. 4(a) and FIG. 7(c). In some embodiments, the height t of a composite electrostatic rod may be about 3 cm to about 5 cm and the cross-section may comprise curved portions having a radius of about 1 cm to 2 cm, resulting in a width D of about 2 cm to 4 cm, as generally shown in FIG. 7c. This may impart an overall natural frequency to the composite electrostatic rod of 70 Hz or greater.

In one embodiment, a composite electrostatic rod having a graphite outer portion and an aluminum core exhibits a natural frequency of at least 75-80 Hz for a rod length of 75 cm. In other embodiments, the core may comprise an aluminum alloy, steel, or composite that provides an even higher strength-to-weight ratio and thereby a higher natural frequency. In one embodiment, a composite electrostatic rod may comprise a metallic core that is encased by a thin outer portion that contains silicon. For example, the outer silicon portion may be a coating of silicon applied by any convenient technique to the metallic core.

Consistent with the present embodiments, an ion implantation system may employ a composite electrostatic lens to improve uniformity of an ion implantation process. In particular the composite electrostatic lens may exhibit an increased natural frequency that causes electric field fluctuations at least 20% more rapid than those exhibited in a conventional electrostatic lens using graphite electrostatic rods. As a consequence, the fluctuation in ion density of the ion beam passing through the electrostatic lens is more rapid, resulting in more rapid fluctuations of the ion beam at the surface of a workpiece. The more rapid fluctuations of the ion beam at the workpiece surface may manifest as more rapid fluctuations of beam current (ion) density at the workpiece surface. When an ion beam, such as a ribbon ion beam is scanned over a wafer, the more rapid variation in ion density may average out the ion flux received at each region of the wafer that is scanned under the ion beam, such that wafer micro-striping by the ion beam is reduced or eliminated. A result of the reduced micro-striping of a substrate provided by the present embodiments is that the scan speed, and therefore substrate through put may be increased.

Figure 8:
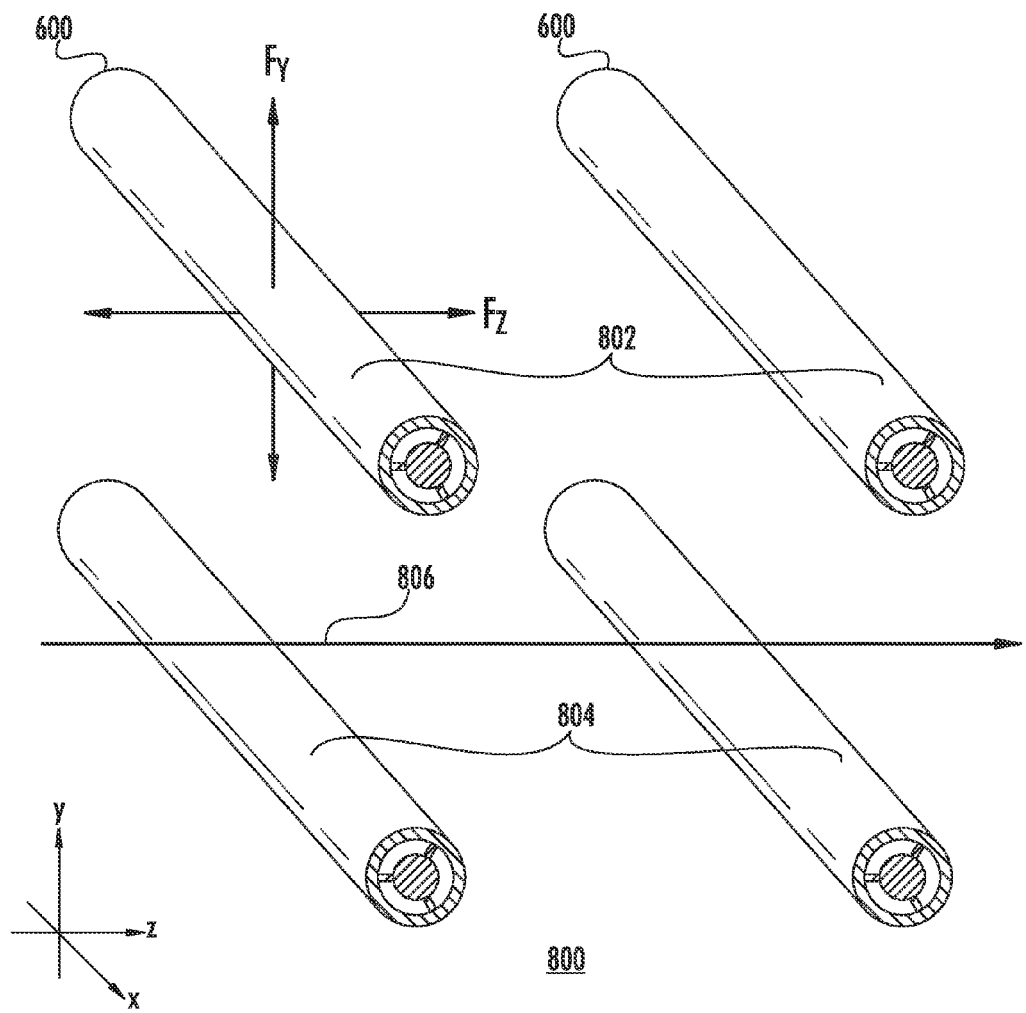
FIG. 8 depicts an exemplary arrangement of composite electrostatic rods.
Figure 1:
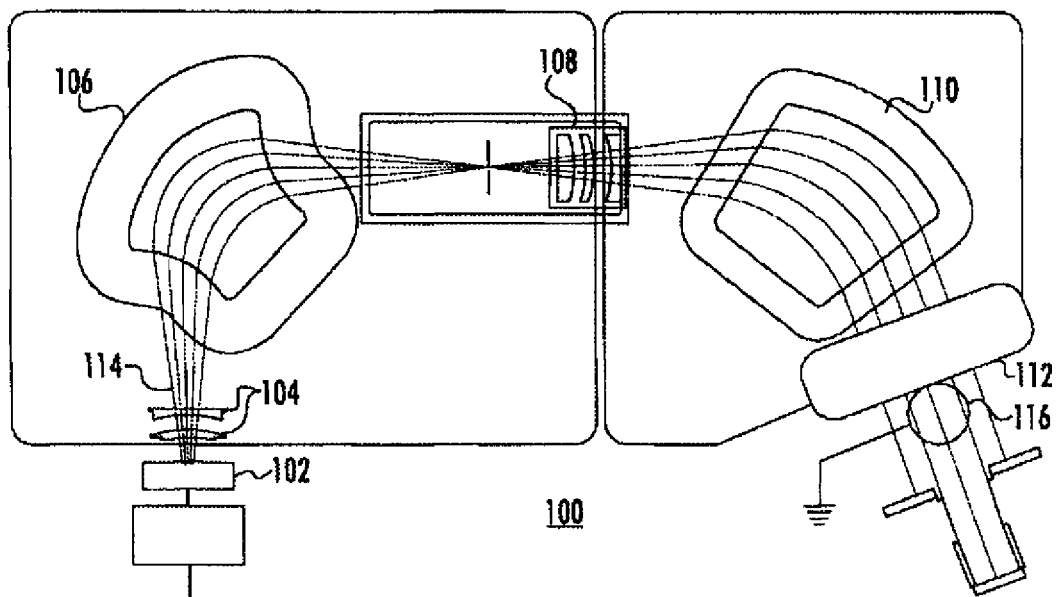
Figure 2A:
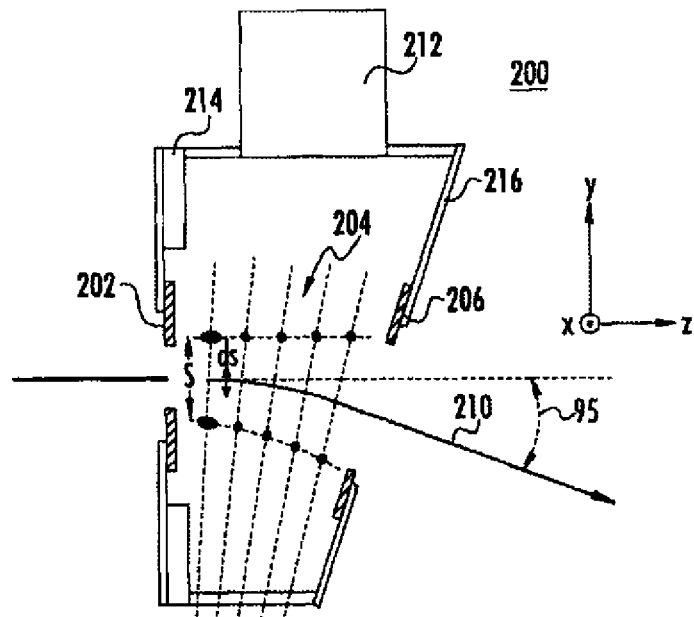
Figure 2B:
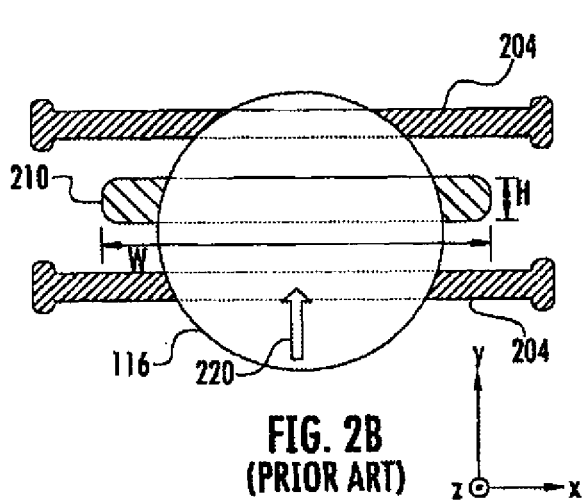
Figure 2C:
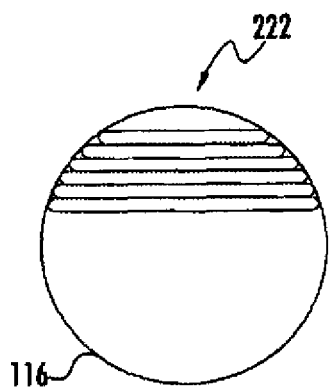

FIG. 8 depicts a perspective view of a portion of an electrostatic lens 800 consistent with the present embodiments. The electrostatic lens 800 includes the aforementioned electrostatic rods 600, which may be arranged in both upper and lower electrostatic rod assemblies 802, 804. In operation, a voltage potential is applied to each electrostatic rod 600 in order to define an electric field to manipulate the ion beam 806. Each electrostatic rod 600 may vibrate at a natural frequency characteristic of one or more vibrational modes. One vibrational mode may be defined by the frequency $F_Z$ along the Z direction, and another vibrational mode may be defined by the frequency $F_Y$ along the Y direction. Vibrations that take place in the Y direction may be particularly problematic for ion beam uniformity, as noted previously. However, vibrations that take place in the Z direction may also perturb electric fields that control the ion beam 806. Consistent with the present embodiments, the electrostatic rods 600 are configured to provide a natural frequency $F_Y$ for vibrations in the Y direction that is higher than that in a graphite rod. In particular embodiments that employ an aluminum core, the natural frequencies $F_Y$ and $F_Z$ is greater than 70 Hz, and in some embodiments is greater than 100 Hz, which may provide an increase in natural frequency of about 20-50% over that provided by graphite electrostatic rods.

A result of the increase in natural frequency of electrostatic lens rods is a proportional increase in the frequency of fluctuation of the ion beam 806. This allows the uniformity of ion dose at a workpiece to be maintained while increasing the scan rate by the same percentage as the increase in natural frequency provided by the composite electrostatic rods. For scan rates at which an ion beam passing through an electrostatic lens containing only conventional graphite electrostatic rods produces microstriping at the workpiece, the increased natural frequency afforded by the composite electrostatic rods of the present invention may reduce or eliminate the microstriping.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings.

Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Thus, the claims set forth below should be construed in view of the full breadth and spirit of the present disclosure as described herein.

What is claimed is:

1. A composite electrostatic lens for controlling an ion beam for ion implantation rod, comprising:
   first and second electrostatic rods defining a gap for transmitting the ion beam therebetween;
   wherein at least one of the first and second electrostatic rods comprises a body having a length L and cross sectional area A, the body comprising:
      an outer portion comprising an upper shell and a separate lower shell that are fastened together, the upper and lower shells formed of a first material; and
      a core formed from a second material different than the first material and surrounded by the outer portion, wherein a natural frequency of the electrostatic rod is greater than that of a graphite rod having the length L and cross sectional area A.

2. The composite electrostatic rod of claim 1, comprising a strength-to-weight ratio greater than that of the graphite rod having the length L and cross sectional area A.

3. The composite electrostatic rod of claim 1, the outer portion comprising a graphite material.

4. The composite electrostatic rod of claim 1, the outer portion comprising graphite, and the core comprising aluminum further comprising a hollow portion disposed between the core and the outer portion.

5. The composite electrostatic rod of claim 4, further comprising a plurality of fasteners extending from the outer portion to the core and operable to fix the core to the outer portion.

6. The composite electrostatic rod of claim 1, the upper and lower shells defining, when assembled, one or more hollow regions within the electrostatic rod.

7. The composite electrostatic rod of claim 1, the electrostatic rod comprising a length of 75 cm and a natural frequency greater than 70 Hz.

8. The composite electrostatic rod of claim 1, comprising an elongated cross-section having a height of 3 to 5 cm, and a width of 2 to 4 cm.

9. The composite electrostatic rod of claim 8, the elongated cross-section comprising curved portions disposed opposite one another and each having a radius of 1 to 2 cm.

10. The composite electrostatic rod of claim 1, the core comprising an "I" shaped cross-section and multiple holes.

11. An electrostatic lens, comprising:
    a first set of electrodes comprising a first set of electrostatic rods; and
    a second set of electrodes comprising a second set of electrostatic rods;
    the first and second sets of electrostatic rods defining a gap to transmit an ion beam therebetween;
       wherein one or more electrostatic rods of the first and second set of electrostatic rods comprises a composite electrostatic rod having a core comprising a first material and outer portion comprising an upper shell and a separate lower shell that are fastened together to surround the core, the upper and lower shells formed of a second material different than the first material;
       wherein the composite electrostatic rod has a length L and cross sectional area A, and wherein a natural frequency of the composite electrostatic rod is greater than that of a graphite rod having the length L and cross sectional area A.

12. The electrostatic lens of claim 11, the composite electrostatic rod comprising a hollow portion disposed within a graphite outer portion.

13. The electrostatic lens of claim 11, the outer portion comprising a metal having a higher strength-to-weight ratio than that of the graphite rod having the length L and cross sectional area A.

14. The electrostatic lens of claim 11, the composite electrostatic rod having a long axis characterized by a first length, each composite electrostatic rod having a natural vibration frequency higher than a graphite rod having the first length.

15. The electrostatic lens of claim 11, the composite electrostatic rod having a length of 75 cm and a natural frequency greater than 75 Hz.

16. The electrostatic lens of claim 11, the gap defining a shape configured to transmit a ribbon ion beam.

17. The electrostatic lens of claim 11, the outer portion of the composite electrostatic rod comprising silicon.

18. The electrostatic lens of claim 11, the composite electrostatic rod comprising an aluminum core and a graphite outer portion.

* * * * *

UNITED STATES PATENT AND TRADEMARK OFFICE
CERTIFICATE OF CORRECTION

| | |
|---|---|
| PATENT NO. | : 8,907,295 B2 |
| APPLICATION NO. | : 13/564450 |
| DATED | : December 9, 2014 |
| INVENTOR(S) | : Naumovski et al. |

Page 1 of 9

It is certified that error appears in the above-identified patent and that said Letters Patent is hereby corrected as shown below:

The title page showing the illustrative figure should be deleted to be replaced with the attached title page.

In the Drawings

In the drawing sheets, consisting of Figs. 1-7, should be deleted to be replaced with the drawing sheets, consisting of Figs. 1-7, as shown on the attached pages.

Signed and Sealed this
Fourteenth Day of April, 2015

Michelle K. Lee
*Director of the United States Patent and Trademark Office*

(12) United States Patent
Naumovski et al.

(10) Patent No.: US 8,907,295 B2
(45) Date of Patent: Dec. 9, 2014

(54) HYBRID ELECTROSTATIC LENS WITH INCREASED NATURAL FREQUENCY

(75) Inventors: Oliver V. Naumovski, Peabody, MA (US); Shardul Patel, North Reading, MA (US); Charles A. Teodorczyk, Danville, NH (US)

(73) Assignee: Varian Semiconductor Equipment Associates, Inc., Gloucester, MA (US)

(*) Notice: Subject to any disclaimer, the term of this patent is extended or adjusted under 35 U.S.C. 154(b) by 0 days.

(21) Appl. No.: 13/564,450

(22) Filed: Aug. 1, 2012

(65) Prior Publication Data
US 2014/0034843 A1 Feb. 6, 2014

(51) Int. Cl.
H01J 49/06 (2006.01)
H01Q 9/04 (2006.01)

(52) U.S. Cl.
CPC .......... *H01J 49/062* (2013.01); *H01Q 9/04* (2013.01)
USPC ........ 250/396 R; 428/367; 428/368; 343/791; 343/872; 343/873

(58) Field of Classification Search
CPC ................................................ H01B 7/16
USPC ............ 428/39.9, 39.91, 367, 368, 138/140, 138/148, 177, 343/791, 872, 873
See application file for complete search history.

(56) References Cited

U.S. PATENT DOCUMENTS

| | | | | |
|---|---|---|---|---|
| 2,981,950 A * | 4/1961 | Skidmore | | 343/788 |
| 3,305,131 A | 2/1967 | Kiyoshi Inoue | | |
| 3,309,455 A * | 3/1967 | Mildner | | 174/29 |
| 4,740,990 A * | 4/1988 | Radev et al | | 373/88 |
| 5,033,028 A * | 7/1991 | Browning | | 367/1 |
| 5,086,256 A * | 2/1992 | Tokiguchi et al | | 315/111.81 |
| 5,554,997 A * | 9/1996 | Cobb | | 343/795 |
| 5,757,334 A * | 5/1998 | Cobb | | 343/873 |
| 2004/0174318 A1 * | 9/2004 | Aisenbrey | | 343/897 |
| 2004/0239570 A1 * | 12/2004 | Aisenbrey | | 343/702 |
| 2008/0132046 A1 | 6/2008 | Walther | | |
| 2010/0171042 A1 * | 7/2010 | Kellerman et al | | 250/396 R |

FOREIGN PATENT DOCUMENTS

| | | |
|---|---|---|
| GB | 371814 A | 4/1932 |
| JP | H11-320098 A | 11/1999 |
| WO | 2010/077418 A1 | 7/2010 |

OTHER PUBLICATIONS

International Search Report and Written Opinion mailed Sep. 26, 2013 for PCT/US2013/048605 Filed Jun. 28, 2013.

* cited by examiner

*Primary Examiner* — Jack Berman
*Assistant Examiner* — James Choi

(57) ABSTRACT

A composite electrostatic rod may include a body comprising a length L and cross sectional area A. The body may include an outer portion comprising a first material, and a core comprising a second material different than the first material and surrounded by the outer portion, wherein a natural frequency of the composite electrostatic rod is greater than that of a graphite rod having the length L and cross sectional area A.

18 Claims, 7 Drawing Sheets

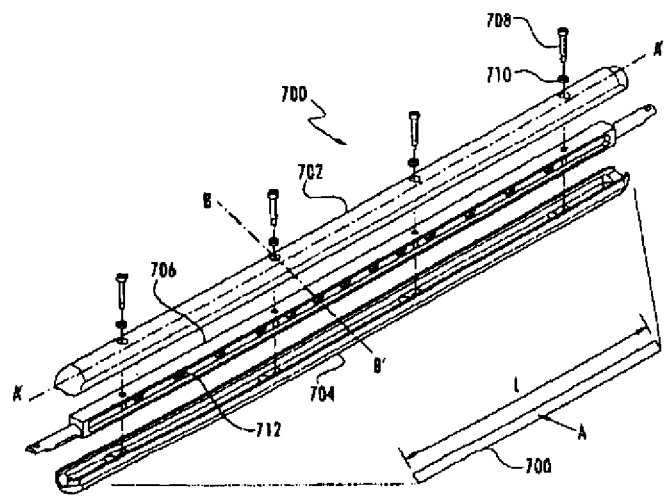

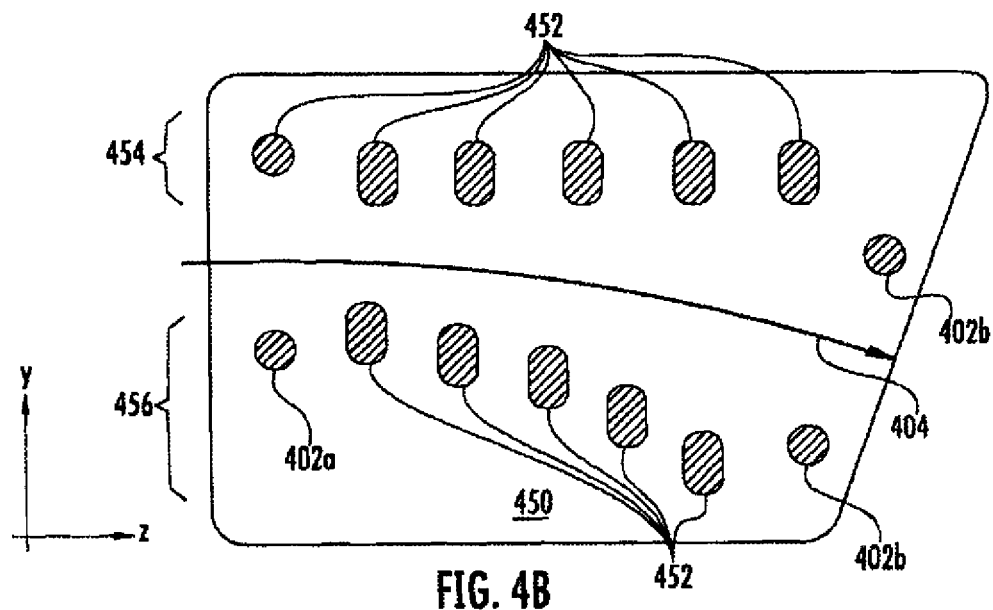
FIG. 4B
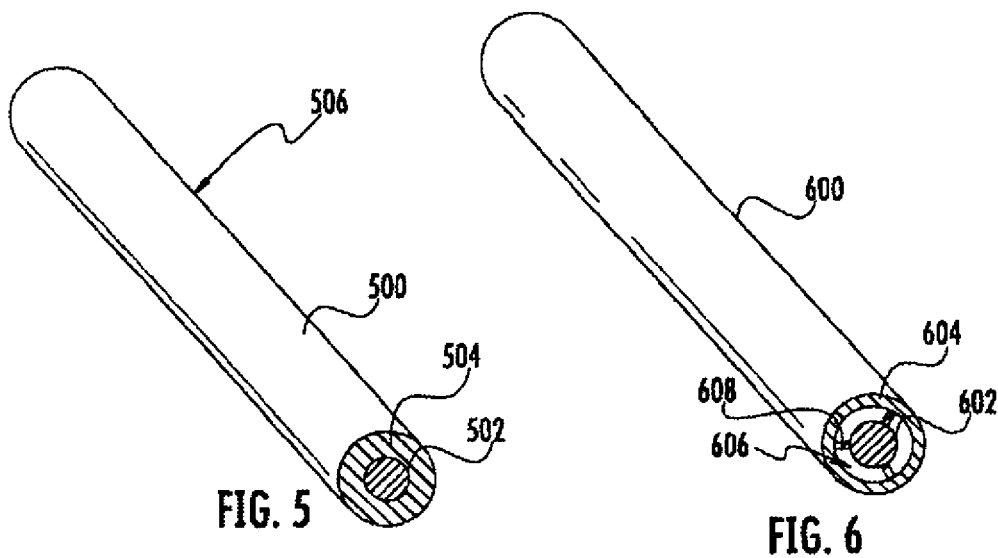
FIG. 5
FIG. 6